United States Patent [19]

Xu et al.

[11] Patent Number: 5,539,367
[45] Date of Patent: Jul. 23, 1996

[54] SUPERCONDUCTING GRADIENT SHIELDS IN MAGNETIC RESONANCE IMAGING MAGNETS

[75] Inventors: Bu-Xin Xu; Yannis P. Tsavalas; Phillip W. Eckels, all of Florence, S.C.

[73] Assignee: General Electric Company, Milwaukee, Wis.

[21] Appl. No.: 236,060

[22] Filed: May 2, 1994

[51] Int. Cl.$^6$ ............................. H01F 7/00; H01F 1/00; G01V 3/00; H02H 7/00
[52] U.S. Cl. .......................... 335/301; 335/216; 361/19; 324/318
[58] Field of Search .................... 335/301, 216; 361/19; 324/300, 307, 309, 318, 319, 320, 322, 315; 128/653

[56] References Cited

U.S. PATENT DOCUMENTS

| | | | |
|---|---|---|---|
| 4,656,447 | 4/1987 | Keim et al. | 335/216 |
| 4,876,510 | 10/1989 | Shiebold | 324/318 |
| 4,990,878 | 2/1991 | Takechi | 335/301 |
| 5,153,803 | 10/1992 | Rapeaux | 361/19 |
| 5,187,327 | 2/1993 | Ohta | 174/35 R |
| 5,289,128 | 2/1994 | De Meester et al. | 324/318 |
| 5,296,810 | 3/1994 | Morich | 324/318 |

FOREIGN PATENT DOCUMENTS

| | | | |
|---|---|---|---|
| 0304126 | 2/1989 | European Pat. Off. | G01N 24/06 |
| 0433002 | 6/1991 | European Pat. Off. | G01R 33/38 |
| 1-74708 | 7/1989 | Japan . | |

*Primary Examiner*—Michael W. Phillips
*Assistant Examiner*—Stephen T. Ryan
*Attorney, Agent, or Firm*—Irving M. Freedman; John H. Pilarski

[57] ABSTRACT

A magnetic resonance imaging magnet including a superconducting gradient shield positioned around the gradient coil and contiguous to the cryogen vessel, with the gradient shield being selectively placed in superconducting operation to shield the magnet coils and structures from the magnetic fields generated by firing the imaging gradient coil positioned within the bore of the magnetic resonance imaging magnet. A plurality of thermally conductive members are compressed between the cryogen vessel and the gradient shield.

7 Claims, 2 Drawing Sheets

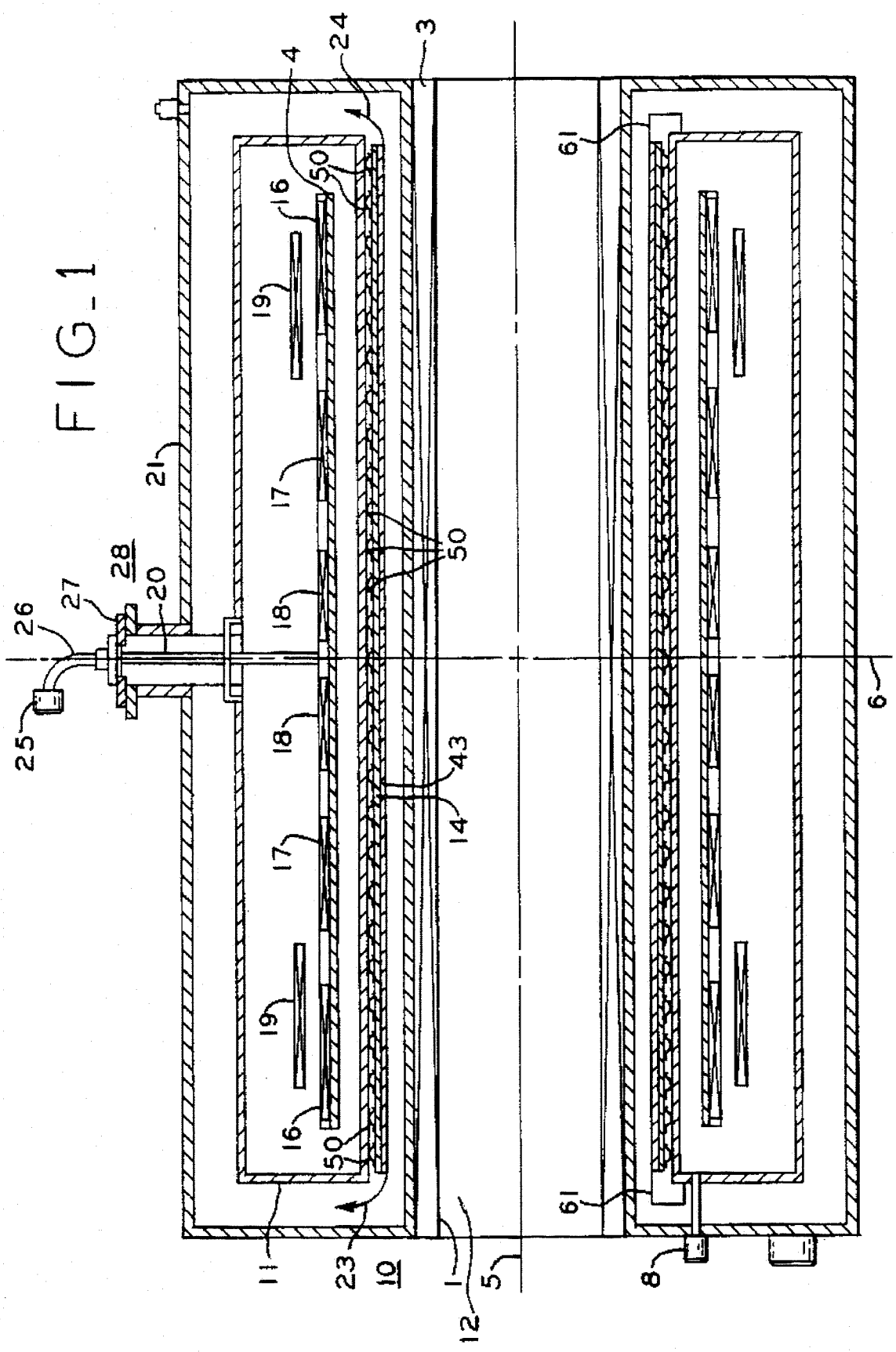

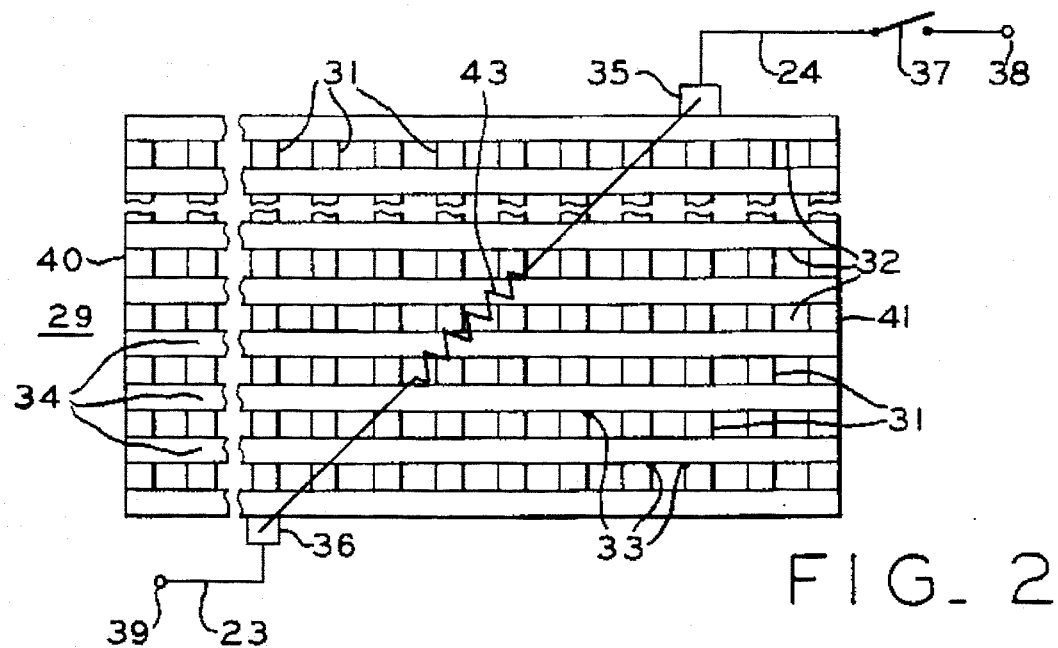
FIG_2
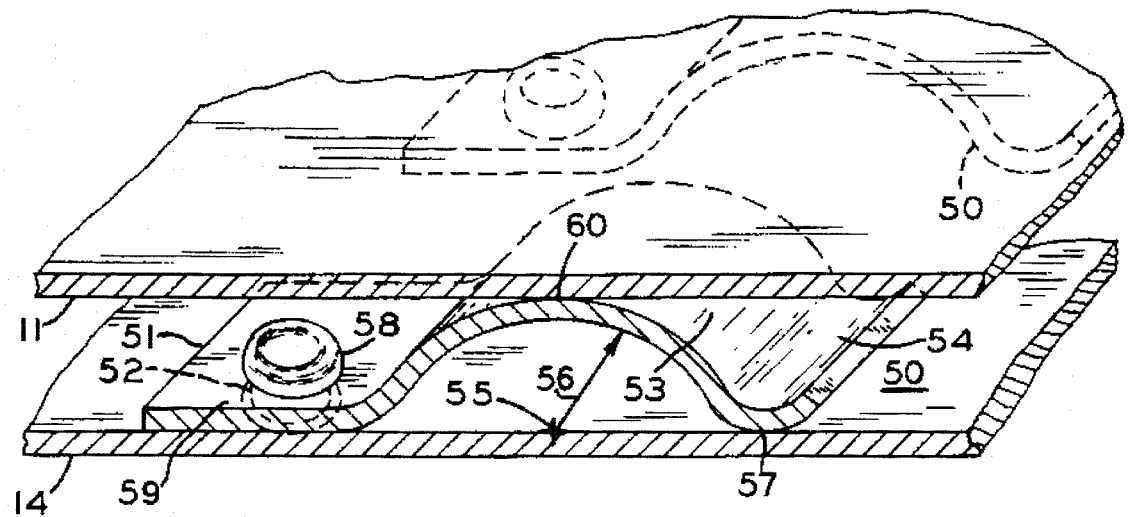
FIG_3

SUPERCONDUCTING GRADIENT SHIELDS IN MAGNETIC RESONANCE IMAGING MAGNETS

As is well known, a magnet coil can be made superconducting by placing it in an extremely cold environment, such as by enclosing it in a cryostat or pressure vessel containing liquid helium or other cryogen. The extreme cold reduces the resistance of the magnet coil to negligible levels, such that when a power source is initially connected to the coil for a period of time to introduce a current flow through the coil, the current will continue to flow through the coil due to the negligible coil resistance even after power is removed, thereby maintaining a strong magnetic field. Superconducting magnets find wide application, for example, in the field of magnetic resonance imaging (hereinafter "MRI").

In a typical MRI magnet, the main superconducting magnet coils are enclosed in a donut shaped pressure vessel, contained within an evacuated vessel and forming an imaging bore in the center. The main magnet coils develop a strong magnetic field in the imaging bore.

Positioned as a sleeve within the evacuated vessel and in the imaging bore is a gradient coil to pulse or fire an additional time-varying magnetic field within the bore to activate or select the specific axial plane within the bore along which the patient imaging takes place Successive images along the axis enables a computerized pictorial of a selected region or organ of the patient being imaged. However, the time varying magnetic field generated by gradient coils can induce eddy currents in various metallic structures of the main magnet assembly and its associated cryostats and in the main magnet coils. The goal of the gradient and magnet system is the perfect fidelity of the target field in the imaging bore. The presence of eddy currents in the main magnet structures and coils are most undesirable in MRI since the eddy currents superimpose a magnetic field on the driven magnetic fields. The eddy current fields have both temporal and spatial dependence. The ideal case for the temporal dependence is to have infinite time constants. In such a case, the target magnetic field is merely the combined driven field plus the eddy current fields. However, due to the resistivity of normal metals, the eddy current fields decay during a gradient pulse or pulse sequence with a finite time constant. Compensation may be achieved by pre-emphasis or de-emphasis of the eddy current components with finite time constants that have the same spatial dependence as the driven field. However, there is often an eddy current component that is not linearly related to the driven field. This component of eddy current exhibits a high order spatial dependence with finite time constants which can not be compensated for and will result in impaired image quality.

Moreover, the presence of eddy currents in the main magnet structures and coils will generate heat in these structures due to their finite electrical resistance. This is the so called AC heating effects of eddy currents. The gradient AC power heating in MRI systems can be from several watts up to 50 or more watts depending on the actual structural parameters and gradient pulse strengths. Such Gradient AC power heating presents serious problems of adequate cooling in conduction cooled MRI equipment, and results in significant helium boil off in the case of helium cooled MRI equipment.

Because of such problems, including the possibility of unacceptable poor quality images, it is necessary to provide a gradient shield between the gradient coil and the main magnet structures in order to provide shielding for the main magnet structures and coils from the time varying magnetic field generated by the gradient coil. Such arrangements have included, for example, a pair of shield or gradient bucking coils wound in opposite directions inserted in series with the gradient coil and carrying an opposite electric current flow to set up magnetic fields which cancel and shield the gradient coil magnetic field from affecting the main magnet structures and coils. However, such arrangements have been complex and less than satisfactory and require electronic amplifiers. Moreover, the arrangement has proved to be a relatively high failure device, and in addition requires the bucking coils be provided as a sleeve within the main magnet bore, necessitating a larger overall magnet size to obtain the desired patient bore size, and a heavier and more expensive superconducting magnet.

Other arrangements have included interposing copper cylinders between the main magnet helium vessel and the gradient coil. However, the copper shield provides undesirable power losses due in part to the parasitic current flow in the copper induced by the magnetic fields to which the copper sleeve is exposed and the magnetic field penetration of the copper. In addition, the time constant of a copper shield is not very long, generally less than a few seconds.

Moreover, existing gradient shields have to be tailored for each superconducting magnet design.

As a result, considerable effort has been directed at the development of improved means of providing shielding between the gradient coils and main magnet structures and coils in a superconducting MRI magnet.

OBJECTS AND SUMMARY OF INVENTION

It is an object of the present invention to provide a magnetic resonance imager with improved shielding between the main superconducting magnet structure and coils and the gradient coils.

It is a further object of the present invention to provide an improved gradient coil shield in a magnetic resonance imager which precludes field penetration of a time varying magnet field and minimizes AC heating losses.

It is another object of the present invention to provide a gradient shield in a magnetic resonance imager which has very long and even substantially infinite time constants, and which enables control of the length of the time constants.

It is yet another object of the present invention to provide an improved gradient shield in a magnetic resonance imager which is also suitable for use in either cryogen cooled or cryogenless conduction cooled magnetic resonance imaging magnets and which can be readily applied to different configuration magnets.

In accordance with one form of the present invention, an improved superconducting MRI magnet assembly includes a superconducting magnet coil in a vessel cooled to a superconducting temperature to provide a magnet field in an imaging bore, and a gradient coil positioned within the bore for generating sequential imaging pulses. A cylindrical superconducting gradient shield is positioned next to the magnet vessel cooled to a superconducting temperature, with the gradient shield surrounding the gradient coil and interposed between the main magnet coil and the gradient coil. Power means provide initial current flow through the main magnet coil to provide superconducting flow through the main magnet coil after discontinuing the initial current flow.

Means are provided to selectively quench the superconducting gradient shield and to selectively reestablish superconducting operation thereafter. The superconducting gradient shield is a cylinder of NbTi or $Nb_3Sn$ sheet or coils impregnated with epoxy resin and inserted into a stainless steel support structure. The $Nb_3Sn$ cylinder may be fabricated of overlapping segments of superconducting $Nb_3Sn$ tape with apertures between the overlaps, and with the overlaps soldered with solder selected to provide desired low resistivity and time constants. A set of heaters in circuit with the external power source for the heaters enables the selective quenching of the superconducting operation of the gradient shield raising the temperature of the gradient shield above its superconducting temperature while the main magnet coils remain in superconducting operation. The superconducting gradient shield eliminates magnetic field penetration of time varying magnetic fields produced by firing the gradient coil and effectively magnetically shields the main magnet structures from the gradient coil, providing a gradient coil shield which has minimum AC heating (typically less than a few milliwatts) and very long (more than a thousand seconds) and even substantially infinite time constants such that it is suitable for general use, including use in cryogenless conduction cooled MRI magnets such as cooling by a mechanical refrigerator.

BRIEF DESCRIPTION OF DRAWINGS

FIG. 1 is a cross section of a superconducting MRI magnet including the present invention.

FIG. 2 shows details of the gradient shield of FIG. 1.

FIG. 3 shows details of the thermal conductivity fingers of FIG. 1.

DETAILED DESCRIPTION OF PREFERRED EMBODIMENT OF INVENTION

Referring to FIGS. 1 & 2, superconducting magnetic resonance imaging magnet assembly 10 includes pressure vessel 11 concentrically within donut shaped vacuum vessel 21 forming a central imaging bore 12 about axis 5. Positioned within pressure vessel 11 is composite drum 4 with three pairs of main magnet coils 16, 17 and 18 of decreasing axial length toward plane 6 perpendicular to axis 5. Main magnet coils 16, 17 and 18 are axially spaced on composite drum 4 and wound in axial slots on the drum. Additional coils such as bucking coils 19 are provided to contribute to reducing the external magnetic field.

External electrical power and control connections are provided through access port 28 by lead assembly 26 which includes connector 25 outside vacuum vessel 21 and conduit 20 passing through plate 27 for electrical connection to the components including magnet coils 16, 17, 18 and 19 within pressure vessel 11. In the case of liquid helium cooled MRI magnet assembly 10, liquid helium is provided through inlet pipe 8 to pressure vessel 11. In the case of cryogenless cooling, mechanical conduction cooling is provided by a thermally linked mechanical cryocooler 8 in place of the liquid helium.

Superconducting gradient shield 14 is a cylindrical member, described in more detail below, which is positioned within the bore and in thermal contact with pressure vessel 11 intermediate main magnet coils 16, 17 and 18 and central imaging bore 12. Positioned in sleeve 1 against the central bore of vacuum vessel 21 surrounding central imaging bore 12 is gradient coil 3 to pulse or fire a series of imaging "snapshot slices" along axis 5 of a patient within imaging bore 12.

Occasionally, gradient shield 14 must be heated above its superconducting transition temperature during the energization of magnet coils 16, 17, 18 and 19, for energization of correction coils (not shown) and for removing residual currents in the gradient shield.

Details of superconducting gradient shield 14 are shown in FIG. 2. Referring to FIG. 2, superconducting gradient shield 14 is fabricated from a sheet of superconducting niobium alloy material such as NbTi or $Nb_3Sn$ bent around a mandrel with ends 40 and 41 connected such as by soldering to form a cylinder 14. Either of these materials can be made superconducting with liquid helium cooling. However, $Nb_3Sn$ can be utilized with cryogenless conduction cooling such that it is suitable and desirable for use in MRI equipment which does not require liquid helium cooling. That is, while NbTi can be operated at a superconducting temperature of around 4° K., $Nb_3Sn$ can be made superconducting at higher temperatures, up to a temperature of around 10K, which can be provided by mechanical refrigerator 8, eliminating the need for liquid helium.

$Nb_3Sn$ tapes as shown in FIG. 2 form sheet 29 by being overlapped in a grid pattern of vertical or axially extending tape segments 31 placed in overlapping position with the horizontally or circumferentially extending tape segments such as 32. The joints, or area of overlap such as 34, are soldered by solder joints such as 33. Sheet 29 is then rolled around a mandrel into cylinder 14 with end segments 40 and 41 suitably joined together such as by soldering or welding.

Electrical power is connected to a superconducting gradient shield heater or resistance heater 43 across heater connections 35 and 36. Heater 43 may be a film heater sandwiched between Kapton layers on cylinder 14. Leads 23 and 24 pass through lead coupling assembly 26 for connection to external power source 38 and 39, with lead 24 connected through switch 37, to power source 38. Switch 37 is positioned outside vacuum vessel 21. Superconducting gradient shield 14 could be fabricated of NbTi wires which, because they are less brittle than $Nb_3Sn$ tape, could be formed into an axially extending cylindrical coil or coils without the use of segments 31 and 32, or could be fabricated from a single continuous sheet of NbTi formed into a cylinder by joining ends 40 and 41 of sheet 29. However, as discussed above, use of NbTi would require the use of liquid helium cooling.

In order to more accurately and effectively control the thermal conductance between superconducting gradient shield 14 and pressure vessel 11, a plurality of beryllium copper fingers 50 are positioned between, and contact, the superconducting gradient shield and the pressure vessel. As shown in FIG. 3, finger 50 includes a substantially planar portion 51 with an aperture 52 in the central region and a curved or bowed extension 53 terminating in a reverse curve, end portion 54. The radius of curvature 56 of curved extension 53 is selected to be slightly greater than the radial clearance between the adjacent surfaces of superconducting gradient shield 14 and pressure vessel 11 in order to compress central portion 60 of bowed extension 53 of finger 14 toward its center of curvature 55, and by the resilient spring action resulting to provide good thermal conductance between the superconducting gradient shield and the pressure vessel. A suitable fastener such as rivet 58 passes through aperture 52 in planar portion 51 and a corresponding aperture 59 in superconducting gradient shield 14 providing good thermal conductance between the planar portion of finger 50 and the superconducting gradient shield with an additional region of thermal conductance 57 where the lower end of end portion 54 contacts the superconducting gradient shield.

There are a plurality of rows of fingers 50 interposed between superconducting gradient shield 14 and pressure vessel 11, with one configuration utilizing 37 circumferential fingers each in an axial row of some 175 fingers per row, or over 6000 fingers in a superconducting magnet assembly in which the inner or bore diameter of pressure vessel 11 is 36.1 inches, the outer diameter of superconducting gradient shield 14 is 35.9 inches, and finger 50 is approximately 9/16 inches long and 1/4 inch wide with a radius 56 of 3/8 inch.

The size, material and number of fingers 14 may be varied to provide control of the thermal conductance and contact resistances of the fingers to obtain the desired thermal characteristics between superconducting gradient shield 14 and pressure vessel 11. In order to be able to alternate between superconducting operation and quenched, non-superconducting operation the thermal conductance should not be too low or too high. When superconducting gradient shield 14 is inserted into the bore of pressure vessel 11, fingers 50 are compressed to provide good thermal contact with the pressure vessel at bowed region 60 of the fingers and to provide additional contact with the superconducting gradient shield at the central region 57 of curved extension 54.

During operation of superconducting MRI magnet assembly 10, main magnet coils 16, 17 and 18 and associated coils such as main bucking coils 19 would be rendered superconducting in the usual manner by passing an electrical current through them after reducing the temperature within pressure vessel 11 to the appropriate superconducting temperature for the material used, and then discontinuing the electrical current flow from external sources. It has been found that superconducting gradient shield 14 allows no field penetration of the time varying magnetic field caused by the firing or pulsing of gradient coil 3 during imaging, to prevent adversely affecting the homogeneous magnetic fields produced by the magnet coils such as main magnet coils 16, 17 and 18 in pressure vessel 11. All time varying magnetic fields caused by the firing of gradient coil 3 are prevented from penetrating the superconducting shield by screening currents in the surface of the superconductor. If the shield has a relatively high intrinsic resistance, such as at the soldered tape cross-overs 33, field canceling currents are generated by inductive coupling action and penetration is retarded according to diffusion of the field through a conductor.

Electrical power connection to superconducting gradient shield heater 43 contiguous to gradient shield 14 by closing switch 37 during superconducting operation of the magnet coils such as main magnet coil 16, 17 and 18 within pressure vessel 11 followed by the superconducting operation of the gradient shield enables the selective erasure of any currents which may accumulate on the gradient shield as a result, for example, of imaging a few patients which could induce such currents. Accordingly, superconducting gradient shield 14 is periodically quenched, or caused to cease superconducting operation, and subsequently brought back into superconducting operation without quenching the superconducting operation of main magnet coil 16, 17 and 18, or of other associated coils such as bucking coil 19. Also, superconducting operation of gradient shield 14 is normally not provided during ramping up of main magnet coils 16, 17, and 18 to superconducting operation. This independent control is accomplished through operation of switch 37 to reestablish external current flow through superconducting gradient shield heater 43 to raise the localized temperature of superconducting gradient shield 14 until the superconducting operation is quenched.

In the case of $Nb_3Sn$ tapes soldered at their overlap regions 34, it is possible, in designing superconducting gradient shield 14, to select a solder which provides a desired electrical resistance at soldered joints 33 to control the time constant of the gradient shield, since the time constant is proportional to the ratio of inductance and resistance of the gradient shield. In addition, the resistive solder joints 33 also function to damp out residual currents avoiding any trapped flux.

Superconducting gradient shield 14 of the present invention is uncomplex and lightweight, does not require amplifiers or balancing required by prior art active gradient shields, and, as pointed out above, is not a lossy shield which generates power losses and heat from time varying magnetic fields. The image currents generated in superconducting gradient shield 14 cancel any eddy current flow in the gradient shield and resultant magnetic fields from the firing of gradient coil 3 by forming opposing current flow on the opposite surface of the gradient shield, precluding magnetic field penetration into main magnet coils 16, 17 and 18 and providing improved fidelity imaging of the target field in imaging bore 12.

Superconducting gradient shield 14 could be placed within pressure vessel 11. However, the quenching of superconducting operation of superconducting gradient shield 14 would result in the application of heat through operation of heater 43 within pressure vessel 11 increasing helium boil-off in the case of cryogen cooling, or increasing and taxing the cooling requirements in the case of cryogen conduction cooling, neither of which is desirable, particularly placing further demands on a cryogenless conduction cooling system operating near its full capabilities. Compressed layers of aluminized mylar could be used in place of fingers 50. In a cryogenless conduction cooled superconducting magnet assembly, superconducting gradient shield 14 may be thermally connected to a thermal shield such as the 10K or a higher temperature thermal shield 61 as shown in FIG. 1.

While the present invention has been described with respect to certain preferred embodiments thereof, it is to be understood that numerous variations and details of construction, the arrangement and combination of parts, and the type of materials used may be made without departing from the spirit and scope of the invention.

What we claim is:

1. A superconducting magnetic resonance imager magnet assembly comprising;

a vessel cooled to superconducting temperatures surrounding a central imaging bore;

at least one superconducting main magnet coil in said vessel and surrounding said imaging bore to provide a magnetic field in said imaging bore;

a gradient coil positioned contiguous to said imaging bore for generating pulsed imaging magnetic fields;

a superconducting gradient shield contiguous to said vessel cooled to superconducting temperatures and interposed between said main magnet coil and said gradient coil;

said superconducting gradient shield shielding said superconducting main magnet coil from effects of the time varying magnetic field generated by said gradient coil; and means to selectively heat said gradient shield to selectively discontinue superconducting operation of said gradient shield independently of continuing superconducting operation of said at least one main magnet coil to erase induced current flow in said gradient shield, and to subsequently reestablish said superconducting operation of said gradient shield;

said means to heat includes a switch and external source of electrical power and wherein said switch enables said selective discontinuance and reestablishment of superconducting operation of said gradient shield independent of the continuing superconducting operation of said main magnet coil;

said switch selectively connects said electrical power to an electrical heater contiguous to said gradient shield; and said superconducting gradient shield is formed from overlapping segments of $Nb_3Sn$ superconducting tape in a grid pattern retained in position by solder and wherein the solder used to solder the overlaps is selected to provide desired resistivity to current flow within said gradient shield.

2. A superconducting magnetic resonance image magnet assembly comprising;

a vessel cooled to superconducting temperatures surrounding a central imaging bore;

at least one superconducting main magnet coil in said vessel and surrounding said imaging bore to provide a magnetic field in said imaging bore;

a gradient coil positioned contiguous to said imaging bore for generating pulsed imaging magnetic fields;

a superconducting gradient shield contiguous to said vessel cooled to superconducting temperatures and interposed between said main magnet coil and said gradient coil;

said superconducting gradient shield shielding said superconducting main magnet coil from effects of the time varying magnetic field generated by said gradient coil; and means to selectively heat said gradient shield to selectively discontinue superconducting operation of said gradient shield independently of continuing superconducting operation of said at least one main magnet coil to erase induced current flow in said gradient shield, and to subsequently reestablish said superconducting operation of said gradient shield;

said gradient shield is an $Nb_3Sn$ cylinder and the cooling to superconducting temperature is provided by a mechanical refrigerator;

said cylinder is formed by overlapping segments of $Nb_3Sn$ tape forming a grid pattern retained in position by solder; and said overlapping segments are soldered with a solder selected to provide a desired electrical resistance to provide the desired time constant for said gradient shield.

3. The superconducting magnet assembly of claim 2 wherein said overlapping segments form multiple conducting paths to provide inductive coupling in generating magnetic field cancelling currents.

4. A superconducting magnetic resonance image magnet assembly comprising;

a vessel cooled to superconducting temperatures surrounding a central imaging bore;

at least one superconducting main magnet coil in said vessel and surrounding said imaging bore to provide a magnetic field in said imaging bore;

a gradient coil positioned contiguous to said imaging bore for generating pulsed imaging magnetic fields;

a superconducting gradient shield contiguous to said vessel cooled to superconducting temperatures and interposed between said main magnet coil and said gradient coil;

said superconducting gradient shield shielding said superconducting main magnet coil from effects of the time varying magnetic field generated by said gradient coil;

wherein said superconducting gradient shield is thermally connected through a plurality of thermally conductive members positioned between and in thermal contact with said superconducting gradient shield and said vessel;

wherein said thermal conductive members are flexible fingers; and wherein said flexible fingers include a substantially planar portion secured at one end to said superconducting gradient shield and further include a bowed resilient portion which contacts the interior bore of said vessel.

5. The superconducting magnet assembly of claim 4 wherein said flexible fingers further include a reverse curved portion at the end remote from said planar portion which is pressed into contact with said superconducting gradient shield when said superconducting gradient shield is positioned within said central imaging bore.

6. The superconducting magnet assembly of claim 5 wherein there are in excess of 1000 fingers.

7. The superconducting magnet assembly of claim 6 wherein said fingers are arranged in axially extending rows around the outer surface of said superconducting gradient shield and there are in excess of 1600 fingers.

* * * * *